United States Patent [19]

Mehrgardt et al.

[11] Patent Number: 4,663,595
[45] Date of Patent: May 5, 1987

[54] DIGITAL INTEGRATED FREQUENCY DEMODULATOR SUBCIRCUIT

[75] Inventors: Soenke Mehrgardt, March; Bernhard Ehret, Freiburg, both of Fed. Rep. of Germany

[73] Assignee: Deutsche ITT Industries GmbH, Freiburg, Fed. Rep. of Germany

[21] Appl. No.: 830,976

[22] Filed: Feb. 18, 1986

[30] Foreign Application Priority Data

Feb. 23, 1985 [EP] European Pat. Off. ........ 85102004.0

[51] Int. Cl.$^4$ ............................................. H03D 3/18
[52] U.S. Cl. ..................................... 329/50; 329/110; 329/122; 375/82; 358/23
[58] Field of Search ................. 329/50, 110, 122, 126; 375/80, 82; 455/214, 337; 358/23, 24, 25

[56] References Cited

U.S. PATENT DOCUMENTS

| 4,528,511 | 7/1985 | Smith | 455/214 X |
| 4,543,532 | 9/1985 | Kasser | 329/110 |
| 4,547,737 | 10/1985 | Gibson | 329/110 X |
| 4,608,540 | 8/1986 | Tsuchiya et al. | 329/110 X |

FOREIGN PATENT DOCUMENTS

| 0035166 | 3/1980 | European Pat. Off. |
| 0059133 | 2/1981 | European Pat. Off. |
| 0080014 | 9/1981 | European Pat. Off. |
| 2219570 | 2/1973 | France |

OTHER PUBLICATIONS

Fernseh & Kino Technik, Band 37, Nr. 5, Mai 1983, Seiten 203–215, Berlin, DE; E. Deguffroy u.a.: "Kammfilter zur Decodierung von Videosignale 3".

Primary Examiner—Eugene R. LaRoche
Assistant Examiner—David Mis
Attorney, Agent, or Firm—Donald J. Lenkszus

[57] ABSTRACT

A subcircuit for the demodulation of SECAM color-television signals has two signal paths each including a low-pass filter (tp1, tp2) which has the transfer function $H(z)=(1+z^{-1})^5$. The amount of area required by the subcircuit on an integrated-circuit chip is thus kept small.

4 Claims, 3 Drawing Figures

DIGITAL INTEGRATED FREQUENCY DEMODULATOR SUBCIRCUIT

BACKGROUND OF THE INVENTION

The invention pertains to an integrated frequency demodulator subcircuit.

A subcircuit of this kind is described in the periodical "Archiv der elektronischen ubertragung (AEu)", 1982, pp. 292 to 298, particularly FIGS. 1 and 2 on pages 293 and 294. This prior art deals with the frequency demodulation of VHF broadcast signals, the arrangement described being designed to also demodulate the stereo signal contained in the VHF broadcast signal in accordance with the European standard.

SUMMARY OF THE INVENTION

One object of the invention is to optimize and improve the prior art subcircuit in such a way as to make it suitable for use in digital frequency demodulations for SECAM color-television signals. Investigations by the inventors show that the prior art arrangement is suited in principle for SECAM demodulation, but the amount of area required by the arrangement on the integrated-circuit chip would be prohibitively large. In accordance with the invention, the circuit is designed to occupy a small area on the chip.

BRIEF DESCRIPTION OF THE DRAWING

The invention will be better understood from a reading of the following detailed description in conjunction with the drawing in which.

DETAILED DESCRIPTION

Figure 1:
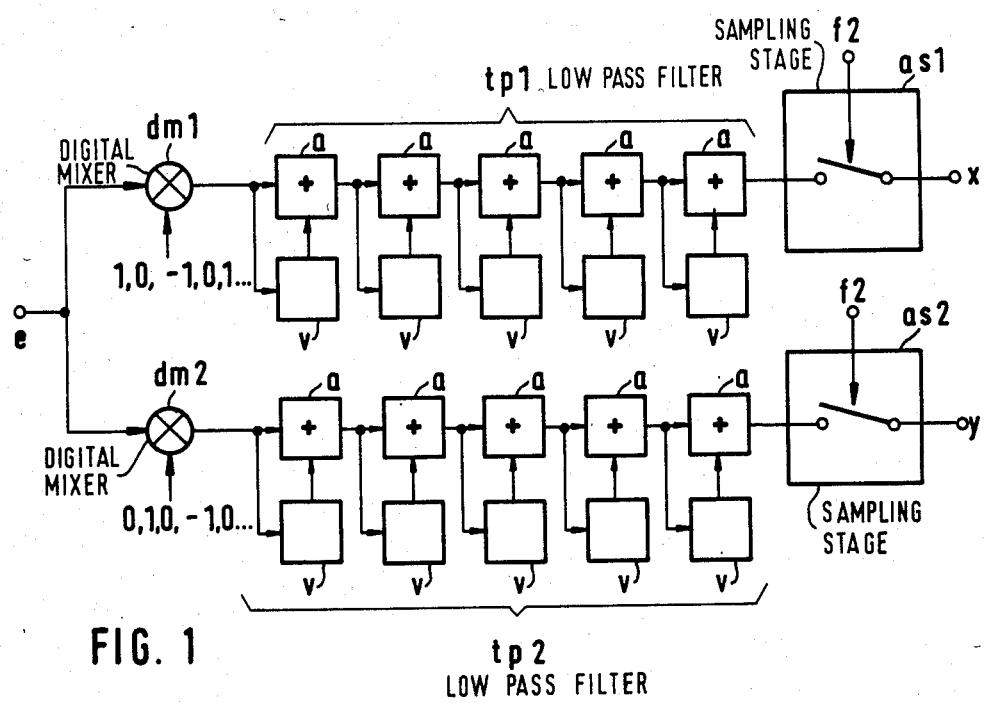
FIG. 1 is a circuit diagram of a frequency demodulator subcircuit in accordance with the invention.

In the circuit diagram of FIG. 1, first and second digital mixers dm1 and dm2 are of conventional design and are interposed in like manner in the two signals paths connected to the input e, the following first and second digital low-pass filters tp1 and tp2, respectively, and the first and second sampling stages as1 and as2, which follow the low-pass filters tp1 and tp2, respectively, and are clocked with the second clock signal f2. At the same sampling instant in each period of the first clock signal f1, binary numbers which are equivalent to the decimal numbers 1, 0, −1, 0, 1 . . . are fed to the first digital mixer dm1, while the second digital mixer dm2 is supplied at the same sampling instants with binary numbers which are equivalent to the decimal numbers 0, 1, 0, −1, 0 . . . As is stated in the publication mentioned above, through the supply of these numerical values, the digital signals at the input e, which are delivered by a suitable analog-to-digital converter (not shown), are mixed with two signals which have the same frequency as the second clock signal, but differ in phase by exactly 90°.

In FIG. 1, each of the two low-pass filters tp1, tp2 consists of a cascade of five nonrecursive digital-filter stages each with the transfer function $H'(z)=1+z^{-1}$, so that the transfer function of each of the low-pass filters tp1, tp2 is: $H(z)=(1+z^{-1})^5$, where z is the complex frequency variable corresponding to the frequency of the first clock signal f1. The individual digital-filter stages are of identical design. Each of them consists of the delay stage v, whose delay is equal to the period of the first clock signal f1, and the adder stage a, one input of which is presented with the undelayed input signal, while the other is supplied with the signal delayed by the delay stage v. Located at the ends of the signal paths and, thus, at the outputs of the digital filters tp1 and tp2 are the first and second sampling stages as1 and as2, respectively, which are clocked with the second clock signal f2 whose frequency is equal to one quarter of the frequency of the first clock signal f1. The output of the first sampling stage as1 is the output x of the first signal path, and that of the second sampling stage as2 is the output y of the second signal path.

Although, for simplicity and ease of illustration, only connecting lines are shown in the figures of the drawing between individual subcircuits as if only single conductors were present, the interconnections are buses consisting of many parallel conductors because the digital signals to be processed are present in parallel form and the signal processing in each of the stages takes place and is completed during one period of the first clock signal f1. This is also apparent from the fact that the frequency of the first clock signal f1 is equal to four times the frequency of the chrominance-subcarrier reference of the SECAM color-television signal; accordingly, the second clock frequency f2 is equal to this reference frequency.

Figure 2:
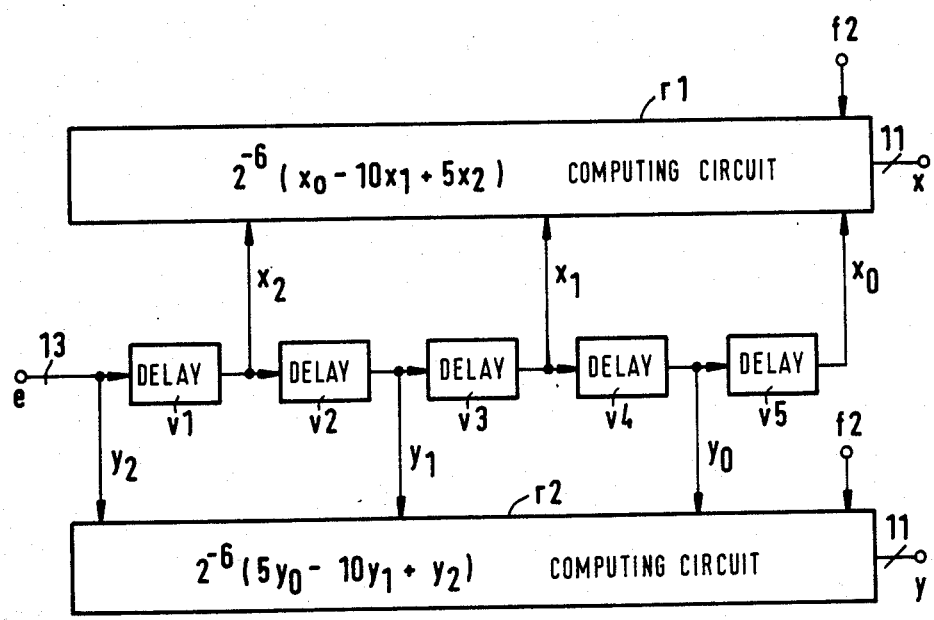
FIG. 2 is a circuit diagram of another, simplified embodiment of the subcircuit of FIG. 1.

FIG. 2 shows a simplified embodiment of the arrangement of FIG. 1 which requires only five of the ten delay stages v of FIG. 1, namely the delay stages v1, v2, v3, v4 and v5, which follow the input e in a cascade arrangement, and whose input signals y2, x2, y1, x1, and y0 and the output signal x0 of the fifth delay stage v5 are applied alternately to the two signal paths. In the first signal path, the input signals of the second and fourth delay stages v2 and v4 and the output signal of the fifth delay stage v5 are fed to the first computing circuit r1, which is designed exclusively to calculate the term $2^{-6}(x0-10x1+5x2)$, whereas the input signals y2, y1, and y5 of the first, third, and fifth delay stages v1, v3, and v5 are fed to the second computing circuit r2, which is designed exclusively to calculate the term $2^{-6}(5y0-10y1+y2)$. What was said about the buses used is indicated in FIG. 2 by a diagonal in the lead connected to the input e, which is designated by the reference number 13, and by diagonals in the leads running to the outputs x and y, which are designated by the reference numerals 11. The numerals signify that 13-bit and 11-bit digital words, respectively, are transferred over these buses in parallel. Accordingly, all subcircuits in the arrangement according to the invention handle the signals in parallel.

Figure 3:
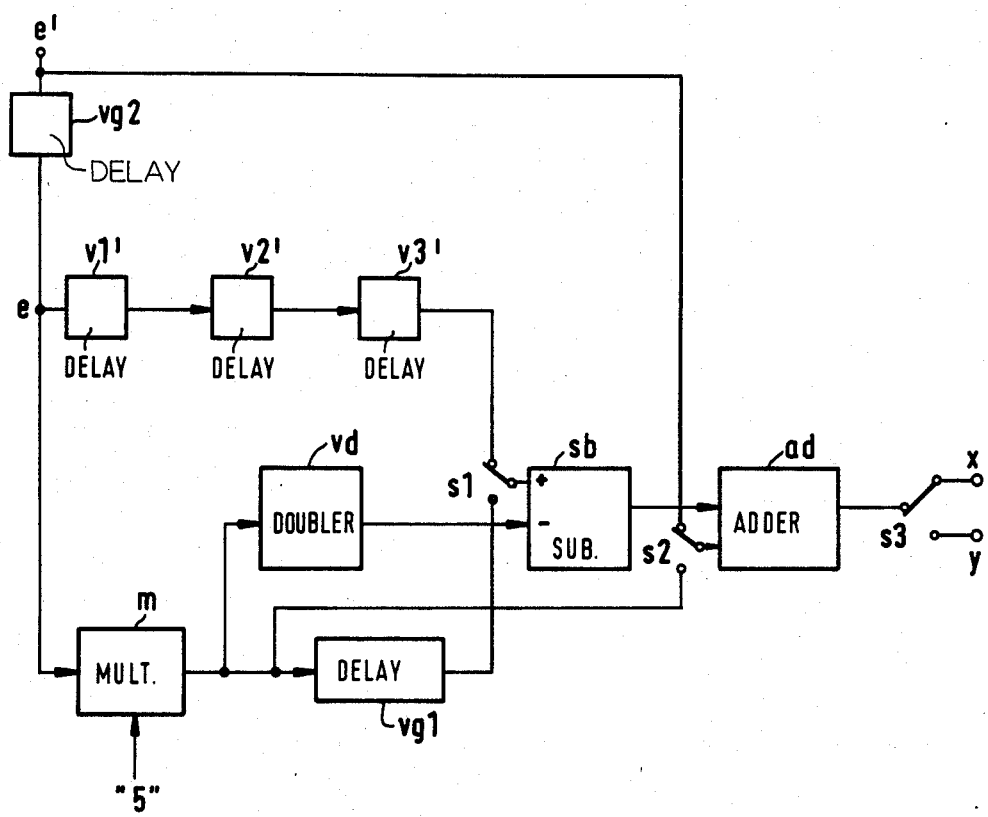
FIG. 3 is a circuit diagram of a further, simplified embodiment which is designed to be implemented in two-phase insulated-gate field-effect transistor technology.

FIG. 3 shows a circuit diagram of a further simplification if the invention is realized using two-phase insulated-gate field-effect transistor circuits. This technique has been known for a long time and is described, for example, in "The Electronic Engineer", March 1970, pages 56 to 61.

In this realization, the five delay stages v1 . . . v5 of FIG. 2, their two associated computing circuits r1, r2, and the two sampling stages as1, as2 of FIG. 1 are functionally united as follws. The input e is followed by the three delay stages v1', v2', v3' in a cascade arrangement. The first clock signal f1 is divided into the two clock phases ph1, ph2 of the two-phase clock system, which have the same frequency as the first clock signal f1. On the leading edge of each first clock phase ph1, the respective signal at the input e is transferred to the first input of the multiplier m, whose second input is fed with a binary word corresponding to the decimal factor "5". On the leading edge of each second clock phase ph2, the output signal of the multiplier m is transferred to the input of the doubler stage vd, i.e., a stage which multiplies the output signal of the multiplier m by a binary word corresponding to the decimal factor 2. This can be done simply by shifting the output signal of the multiplier m one place to the left in the straight binary code, as is well known.

On the next leading edge of the first clock phase ph1, the output signal of the doubler stage vd is applied to the subtrahend input of the subtracter sb. The output of the third delay stage v3' is coupled to the first input of the first electronic switch s1, whose output is connected to minuend input of the subtracter sb. The second input of the first electronic switch s1 is connected to the output of the multiplier m via the first delay element vg1, which delays the multiplier's output signal by 2.5 times the period of the first clock signal f1. The output of the subtractor sb is coupled to the first input of the adder ad. The input e is preceded by the second delay element vg2, which provides a delay equal to half the period of the first clock signal f1. The input thus formed, e', is connected to the first input of the second electronic switch s2, whose second input is connected to the output of the multiplier m, and whose output is coupled to the second input of the adder ad.

Within four periods of the first clock signal f1, the first inputs of the two switches s1, s2 are connected to the outputs of the respective switches during the second and fourth periods, and the second inputs during the first and third periods. The output of the adder ad is connected to the input of the third electronic switch s3. The input is connected to the output x of the first signal path during the third period, and to the output y of the second signal path during the fourth period.

As mentioned above, the computing subcircuits, i.e., the multiplier m, the subtracter sb, and the adder ad, perform the computation within a maximum time equal to half the period of the first clock signal f1, i.e., within a maximum period of 28 ns. Such simple computing circuits are realizeable without difficulty. The multiplier m is preferably implemented as a series combination of two adders the first of which shifts the multiplier's input signal two places to the left, which correspond to a multiplication by the decimal factor 4, and the second of which adds the input signal to the result of the shift. After one period of the first clock signal s1, a signal equal to ten times the signal value present at the input e at the end of the preceding period appears at the subtrahend input of the subtracter sb. Similar time considerations apply to the other input of the subtracter sb and to the two inputs of the adder ad.

What is claimed is:

1. A digital integrated frequency demodulation subcircuit for frequency demodulation in color television apparatus, said subcircuit comprising:
   an input terminal receiving frequency modulated analog signal samples at a sampling rate determined by a first clock signal;
   first and second signal paths connected to said input terminal;
   said first signal path comprising:
   a first digital mixer for mixing said samples with first predetermined signals, a first digital low-pass filter coupled to the output of said first digital mixer, and a first sampling stage following said first digital low pass filter and clocked by a second clock signal;
   said second signal path comprising:
   a second digital mixer for mixing said samples with second predetermined signals, a second digital low pass filter coupled to the output of said second digital mixer, and a second sampling stage following said second digital low pass filter and clocked by said second clock signal;
   said first clock signal being four times the frequency of said second clock signal; and
   each of said first and second low pass filters has the transfer function $$H(z)=(1+z^{-1})^5$$

where
   z is the complex frequency variable corresponding to the frequency of said first clock signal and $z^{-1}$ symbolizes the delay produced by each of a number of like delay stages contained in said first or second low pass filters, said delay being equal to the period of said first clock signal.

2. A subcircuit in accordance with claim 1, wherein:
   said first predetermined signals correspond to first binary signals equivalent to decimal numbers 1, 0, −1, 0, 1 . . . , and said second predetermined signals correspond to second binary signals equivalent to decimal numbers 0, 1, 0, −1, 0 . . . , and at the same sampling instant in each period of said first clock signals, said first and second binary signals are respectively applied to said first and second digital mixers.

3. A digital integrated frequency demodulation subcircuit for frequency demodulation in color television apparatus, said subcircuit comprising:
   an input terminal receiving samples of a frequency modulated analog signal at a sampling rate determined by a first clock signal;
   a plurality of delay stages connected in cascade, the first of said delay stages having its input coupled to said input terminal;
   a first computing circuit coupled to first predetermined ones of said delay stages to compute the term $2^{-6}(x0-10x1-5x2)$; and
   a second computing circuit coupled to second predetermined ones of said delay stages to compute the term $2^{-6}(5y0-10y1+y2)$ where y0, y1 and y2 and x0, x1 and x2 are inputs of selected ones of said plurality of delay stages.

4. A digital integrated frequency demodulation subcircuit for frequency demodulation in color television apparatus, said subcircuit comprising:
   an input terminal receiving samples of a frequency modulated analog signal at a sampling rate determined by a first clock signal;
   first and second clock phases of a two-phase clock system each having the same frequency as said first clock signal;
   a second delay state coupled to said input terminal and having a delay equal to one half the period of said first clock signal;
   a plurality of cascaded delay stages coupled to the output of said second delay stage;

a multiplier coupled to the output of said second delay stage such that on a predetermined edge of each said first clock phase, the signal at the output of said second delay stage is transferred to a first input of said multiplier, said multiplier having a second input receiving a binary word corresponding to a predetermined factor;

a doubler stage operable on a predetermined edge of each second clock phase such that the output of said multiplier is transferred to the input of said doubler stage and operable on the next said predetermined edge of said first clock phase to provide an output signal;

a subtracter having its subtrahend input coupled to said doubler stage to receive said output signal;

a first electronic switch having a first input coupled to the output of said plurality of cascaded delay stages, an output coupled to the minuend input of said subtracter and having a second input;

a first delay element coupling said multiplier output to said first electronic switch second input, said first delay element having a delay equal to 2.5 times the period of said first clock signal;

an adder having its first input coupled to said subtracter output;

a second electronic switch having a first input coupled to said input terminal, a second input coupled to said multiplier output, and having an output coupled to the second input of said adder;

said first and second electronic switches being operable such that during second and fourth periods of four sequential periods of said first clock signal, said first input of each of said first and second electronic switches is connected to the respective said output of said first and second electronic switches, and during first and third periods of said four sequential periods said second input of each of said first and second electronic switches is connected to the respective said output of said first and second electronic switches; and a third electronic switch for connecting the output of said adder to a first output during said third period and to a second output during said fourth period.

* * * * *